(12) United States Patent
Leutsch et al.

(10) Patent No.: US 6,287,642 B1
(45) Date of Patent: Sep. 11, 2001

(54) METHOD FOR COATING A RUBBER WIPER BLADE

(75) Inventors: Wolfgang Leutsch, Buehlertal; Johannes Rauschnabel, Stuttgart, both of (DE); Jeanne Forget, Mountain View, CA (US); Johannes Voigt, Leonberg (DE)

(73) Assignee: Robert Bosch GmbH, Stuttgart (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/424,729
(22) PCT Filed: Feb. 5, 1999
(86) PCT No.: PCT/DE99/00301
§ 371 Date: Mar. 14, 2000
§ 102(e) Date: Mar. 14, 2000
(87) PCT Pub. No.: WO99/51471
PCT Pub. Date: Oct. 14, 1999

(30) Foreign Application Priority Data

Apr. 2, 1998 (DE) .............................................. 198 14 805

(51) Int. Cl.⁷ ...................... C23C 16/513; C23C 16/511; C23C 16/02; B05D 1/36; H05H 1/00
(52) U.S. Cl. .......................... 427/536; 427/488; 427/492; 427/491; 427/509; 427/533; 427/554; 427/562; 427/569; 427/596; 427/255.28; 427/255.6; 427/248.1; 427/322; 427/402; 204/192.12; 204/192.16

(58) Field of Search ..................................... 427/488, 492, 427/491, 509, 515, 489, 533, 536, 554, 562, 569, 596, 447, 255.28, 255.6, 255.5, 316, 322, 906, 248.1, 402; 204/192.12, 192.16

(56) References Cited

U.S. PATENT DOCUMENTS

| 3,669,719 | * | 6/1972 | Doede et al. | ......................... 117/93.1 |
| 4,539,185 | * | 9/1985 | Muller et al. | ......................... 422/233 |
| 5,041,304 | * | 8/1991 | Kusano et al. | ......................... 427/41 |

(List continued on next page.)

FOREIGN PATENT DOCUMENTS

| 848 694 | 5/1977 | (BE) . |
| 2623216 C3 | 10/1981 | (DE) . |
| 19731181 | * 2/1998 | (DE) . |

(List continued on next page.)

OTHER PUBLICATIONS

D. Widmann: Technologie hochintegrierter Schaltungen, 2. Auflage, pp. 13–34, 1996.

Primary Examiner—Shrive Beck
Assistant Examiner—Michael Barr
(74) Attorney, Agent, or Firm—Michael J. Striker

(57) ABSTRACT

In the process for coating the elastomeric rubber wiper a vaporous coating material is generated and activated by a plasma and/or laser; a protective coating is formed on a rubber wiper surface by exposing it to the vaporous coating material by CVD and/or PVD methods and process parameters for the coating process are controlled so that the protective coating includes at least three coating layers and has a total thickness of from 200 nm to 2 $\mu$m. The coating layers include at least one thicker softer elastic coating layer with elastomeric properties similar to those of the rubber wiper and other thinner harder coating layers having wear-resistant properties. The other thinner harder coating layers have respective hardness increasing from an inner most one to an outermost one of the other thinner harder coating layers.

20 Claims, 4 Drawing Sheets

U.S. PATENT DOCUMENTS

| | | | |
|---|---|---|---|
| 5,088,908 | * | 2/1992 | Ezaki et al. ............................ 425/73 |
| 5,202,623 | * | 4/1993 | LePage ............................ 324/158 F |
| 5,346,729 | * | 9/1994 | Pitts et al. ............................ 427/582 |
| 5,395,735 | * | 3/1995 | Nagata et al. ....................... 430/270 |
| 5,527,629 | * | 6/1996 | Gastiger et al. .................... 428/688 |
| 5,549,935 | * | 8/1996 | Nguyen et al. ...................... 427/490 |
| 5,635,087 | * | 6/1997 | Schiller et al. ................. 219/121.43 |
| 5,643,638 | * | 7/1997 | Otto et al. ............................ 427/569 |
| 5,846,883 | * | 12/1998 | Moslehi ............................... 438/711 |

FOREIGN PATENT DOCUMENTS

| | | | |
|---|---|---|---|
| 260516 | * | 3/1988 | (EP) . |
| 264227 | * | 4/1988 | (EP) . |
| 330524 | * | 8/1989 | (EP) . |
| 691419 | * | 1/1996 | (EP) . |
| 2202237 | * | 9/1988 | (GB) . |
| 60-67655 | * | 4/1985 | (JP) . |
| 4-107254 | * | 4/1992 | (JP) . |
| 9/125253 | * | 5/1997 | (JP) . |
| 9-241097 | * | 9/1997 | (JP) . |
| 10-35418 | * | 2/1998 | (JP) . |

* cited by examiner

METHOD FOR COATING A RUBBER WIPER BLADE

BACKGROUND OF THE INVENTION

1. Field of the Invention

The present invention related to a coating process for a rubber wiper and, more particularly, to a coating process for a rubber wiper made of elastomer material, in which a wear-resistant protective coating is formed on the rubber wiper by a chemical and/or physical vapor deposition method from a vaporous coating material generated and activated thermally, by plasma and/or by laser.

2. Prior Art

Known windshield wipers possess a wiper arm incorporating a fastening device secured to a drive shaft, a hinged portion connected therewith by way of a toggle joint, and a wiper rod rigidly secured to the hinged structure. In addition, the windshield wiper possesses a wiper blade, featuring a bearing yoke assembly and a rubber wiper supported by it. The wiper blade is hinged on the wiper arm, whereby a hook-shaped extremity of the wiper rod projects between the two side cheeks of the bearing yoke, embracing a hinged bolt. The articulation constructed in this fashion guides the wiper blade with its rubber wiper over the windshield of the motor vehicle, whereby the hinged portion and the bearing yoke make it possible for the rubber wiper to adapt to the curvature of the windshield. The requisite contact pressure of the rubber wiper upon the windshield of the vehicle is achieved by at least one tension spring, which braces the fastening device and the hinged structure together with the wiper rod by way of the toggle joint.

The rubber wiper consists of an elastomer, for example a natural or synthetic rubber. It has a head cleat connected via a rocker flange with a wiper lip butting against the windshield to be wiped. By way of the rocker flange, the wiper lip is able to shift in inverse direction at the turnabout point of its wiper travel, so as to retain at all times a proper angle to the windshield. When the wiper is activated, the rubber wiper glides over the windshield of the vehicle with its wiper lip, whereby the friction between the lip and the windshield causes the former to abrade. Beyond that, the rubber wiper is subject to environmental factors such as temperature changes, UV radiation, seawater, exhaust gases etc., which may cause premature aging of the materials and enhanced wear.

In principle, wear can be reduced by improved gliding properties, reduced friction and/or harder rubber wipers. German patent DE 26 23 216 describes rubber wipers initially halogenated with chlorine or bromine in a chemical wet hardening process and subsequently treated with a moderate to strongly alkaline solution at temperatures up to 100° C.

After producing the rubber wiper, for example by extrusion, it features a proper, smooth surface. The chemical wet hardening process affects the rubber wiper in its entirety, so that its material properties change, even where that is not required or is very undesirable. Beyond that, its microstructure and macrostructure are altered, for example by chlorine and heat. As a rule, the rubber turns coarser and more brittle, impairing its contact with the windshield and its wiping efficacy. In addition, there is a danger that small or larger particles may break out of the rubber wiper in wiping the windshield. Moreover, for proper cleansing quality, the wiper lip should quickly and easily flip over in reversing its travel direction, without significant resistance. Yet, with harder and more brittle material, its resistance is increased, impeding or at least retarding the reversal process, and there is a tendency for the wiper blade to rattle.

Belgian patent BE 84 8 964 A describes a coating process apt to improve the gliding properties after a hardening process. Accordingly, the rubber wiper receives at least in the area of the lip, by a chemical wet process, a coating which is softer than the base material and is therefore not particularly resistant to wear.

SUMMARY OF THE INVENTION

Coating processes wherein the coating materials are mixed or utilized in a vaporous state, then conveyed to the surface of the object to be coated, and deposited thereon may be basically classified as PVD (Physical Vapor Deposition) and CVD (Chemical Vapor Deposition) processes.

Such coating processes are especially known in coating silicon wafers for integrated semiconductor circuits (cf. D. Widmann; H. Mader; H. Friedrich. 2nd ed. Springer 1996, p. 13–34). CVD processes, also referred to as gas phase deposition processes, are triggered by chemical reactions, in the sense that the applied coating materials turn into a coating in a chemical reaction on the coated surface. Conversely, PVD processes are primarily triggered by physical factors, such as for example cathodic sputtering, although there is no clearcut dividing line between these processes.

The advantage of these processes consists in the possibility of creating many different, particularly thin, compact and highly cross-linked coatings. Thin layers, though hard, may be made flexible and resistant to break-up as the rubber wiper is deformed. The compact surface is preserved, lending it high chemical resistance, in that no aggressive agents, such as seawater, exhaust gases etc. will penetrate between the coating and the rubber wiper to attack it and peel off the coating.

Beyond that, thin coatings require less coating materials. There is little waste and the need to keep coating materials in stock is limited. Because of the limited quantity of materials, the coating equipment may be readily sealed off tight towards the outside. There is no need for chemically aggressive solvents and the coatings require no time-consuming drying and hardening cycles. The production processes are friendly to the environment, economical and well suited to large -scale production.

Beyond that, a special advantage of these processes lies in the fact that while the wiper is being coated, the process parameters may be simply varied, and the properties of the coating may be altered within a thin layer so as to match specific requirements. Within the inner structure of the rubber wiper, it is possible to achieve in one single process an elastic and soft coating system adapted to the properties of the rubber wiper, with a hard, wear-resistant outer coating.

In the transition from a soft to a thin and hard coating within an altogether thin coating system, the latter is on the whole elastic, with no more than limited effect on the elasticity of the rubber wiper, with which it is securely bonded. The coating system will not peel off when the rubber wiper is deformed, and it is chemically resistant.

Particularly advantageous is a smooth transition from elastic/soft to the wear resistant/hard region. In one embodiment of the invention, it is proposed that the process parameters be varied, as for example the blending ratios of process gases, the electric or thermal input, the distance between the source of the material and the rubber wiper, flow parameters, etc., so as to achieve an infinitely variable gradient layer, that is, a layer whose stock parameters and properties follow from inside out, perpendicular to the rubber wiper and consistent with the chemical and morphologic gradients, possessing at all times constant properties along one plane in the longitudinal direction of the rubber wiper. Nevertheless, under different boundary conditions in the production process, it may be more advantageous to alter process parameters gradually in order to produce a multi-ply layer, in other words, several overlapping thin layers deviating slightly in the properties of the stock.

The gradient layer or multi-ply coating may at the same time form the outer hard and wear-resistant top coating. It is also possible to apply the wear-resistant hard coating in a separate deposition stage. One proposed embodiment of the invention envisages an additional final application of a dry lubricant and/or hydrophobic coating. Good results have been achieved with coatings having a water wetting contact angle between 60 and 150 degrees, preferably over 90 degrees.

In one preferred embodiment, it is also possible to deposit only one homogeneous gradient-free layer. This simplifies the deposition process and may lead to a distinct enhancement of wiper properties and wear resistance.

Particularly suitable as coating materials are halogen, silicon or carbon-containing and/or metallo-organic materials or monomers, that is, low-molecular cross-linkable substances, whereby the carbon, nitrogen, oxygen, fluorine and/or metal content varies from the inside outward, enhancing hardness and/or wear resistance of the coating system. For example, an appropriate multi-ply layer or gradient coating may be attained with a silicon-based mixture, to which carbon is increasingly added during the process, that is, converted in a chemical gradient into an increasingly carboniferous mixture. Particularly suitable for the final outer coating are carbon-rich compounds containing halogens and/or metals, advantageously manufactured with fluorine-containing gases, low oxygen siloxan monomers and hydrocarbon gases. The outer surface of the coating is thereby endowed with the desired hydrophobic and/or dry lubricant properties, with the resultant good gliding properties, especially on hydrophilic windshields. A higher coefficient of friction may result in an oxide or nitride multi-ply or gradient layer, whereby a final hydrophobic coating apt to enhance the gliding properties is especially advantageous. Such a final hydrophobic coating persists over an extended period of time by its co-valent bonding to the multi-ply layer or the gradient coating.

In order to enhance the stability of the overall coating system, one embodiment of the invention proposes that the rubber wiper be cleansed and/or activated thermally, photochemically and/or in a plasma-assisted process, for example with halogen, oxygen and/or nitrogen-containing gases. The plasma fine-cleansing or activation and/or roughening of the surface is preferably accomplished with microwave impulses and/or biasing, or with a frequency generator operating at 13.56 MHz and a self-adjusting biasing potential. The bias is imparted by an electrode over which the rubber wiper is guided with the rear side of the area to be cleansed. The stability of the system may be further enhanced by a metallic, organic and/or silicon nitrogen containing adhesion-improving coating applied directly onto the rubber wiper. As a rule, such a coating is no more than a few 10's nm thick.

The coating materials may be compounded in a vaporous state by heat, plasma and/or laser means, and/or subjected to further breakdown while already in a vaporous state. True, heat-activated CVD processes have the disadvantage that the rubber wiper is as a rule subjected to greater thermal stresses, however, the heat may at the same time be advantageously utilized as a pretreatment, leading to a denser film growth.

One embodiment proposes that at least one of the processes be plasma-assisted. In relation to plasma-activated CVD processes, it is possible to differentiate between a thermally activated hot plasma and a frequency activated cold plasma. Usable exciter frequencies range from 50 KHz to 2.45 GHz, preferably 2.45 GHz with ECR magnetic field activation, and most preferably 13.56 MHz. In the case of the thermally activated plasma, the heat may be used for the pretreatment or activation of the rubber wiper, to achieve high rates of deposition and cost-effective coating systems. In order to secure intrinsically elastic coating systems with the least possible stresses, the monomers are preferably added in the colder ranges of the plasma, whereby the monomers are not fragmented into their atomic components, but form softer and intrinsically elastic layers. Moreover, a faster film growth is achieved, with lower thermal stresses of the rubber wiper.

Where the plasma is generated by a frequency generator, for example a high-frequency, radio frequency or microwave frequency source, the thermal stresses on the rubber wiper may be minimized, as compared to purely CVD processes. With the input frequency, the radical portion, the deposition rate and the film growth increase, reducing the process costs.

The plasma generators may be operated continuously and/or pulsed. In the case of the pulsed operation, the rubber wiper has a chance to recover during the intervals from the bombardment with the radicals, charged particles etc. and especially from thermal stresses. Cold gas molecules are capable of dissipating the heat away from the rubber wiper. Beyond that, it is possible to achieve a higher rate of film growth, in that the monomers are capable of preliminary reaction, thereby affording a higher deposition rate.

For coating purposes, the rubber wiper may be passed directly through or over the plasma. When coated through the plasma, the thermal stress on the rubber wiper is greater, however, with the fast growth of the film, it is possible to achieve hard, wear-resistant coatings within a shorter processing time. When coated outside the plasma, the rubber wiper is less stressed, the monomers may undergo preliminary reaction on the way to rubber wipers, so that notwithstanding the losses occasioned by the greater distance, it is possible to achieve high rates of deposition, fast growth of the film and softer coatings. It is also feasible to coat the rubber wiper initially outside the plasma with a softer coating adapted to the material of the rubber wiper, and then inside the plasma, with a harder, more wear resistant coating.

The plasma-assisted deposition of the layer may lead to denser, more wear-resistant coatings when the rubber wiper is exposed to a biasing potential. As previously described in relation to the cleansing process, the rubber wiper is guided over an electrode carrying a biasing potential. The bias is fed pulsed or unpulsed to ground or a counter-electrode. The pulse frequency lies between 10 KHz and several MHz's, preferably 50 to 250 MHz. The biasing potential may also be fed from a frequency generator at 1 MHz to 100 MHz, preferably between 50 MHz and 27 MHz, and most preferably 13.56 MHz. The biasing current propels ions from the plasma in the direction of the wiper surface, where they impact against the previously deposited layer leading to a renewed cross-linking/compacting of the coating. It is advantageous for the biasing current to be self-adjusting at a level between a few volts and 2 kilovolts.

One embodiment of the invention suggests using a laser-activated process, notably a CVD process with one or several lasers. A laser, for example an Excimer laser, is capable of inputting energy into a spatially circumscribed and exactly determinable area. In this way, the coating system may be applied in a targeted, spatially limited area of the rubber wiper only, preferably in the region in contact with the windshield. The rubber wiper is exposed to thermal stresses over a very limited area only, leaving the elasticity of the rest of the wiper unaffected, particularly in the vicinity of the rocker flange, so that the reversing process is unaffected by the coating and the coating system. The material and energy usage is lessened and the contamination of the equipment is reduced. A further technical advantage lies in the fact that the laser coating process is always linear, since the energy may be concentrated onto a spot of limited diameter. Laminar coatings are achieved by scanning the path of the laser beam. Rubber wiper edges are linear substrates, which can in principle be coated without scanning the beam, thereby saving optomechanical control elements, and adaptation to different substrates, simplifying synchronization of various beams, for example for pre-activation, the actual coating and renewed cross-linking.

All coating processes may be executed in such a way that the rubber wiper is coated on both sides, either simultaneously (for example, with two coating lasers) or in succession, on one side only, over the entire surface, or just partially (for example, just the wiper lip, as previously described for the laser process).

Established purely PVD processes include plasma injection and sputter or cathode sputtering. Compared to vapor deposition processes in which the treated articles are heated high enough to achieve vapor pressure sufficient for vaporization, cathode sputter permits better control of the coating composition, thereby achieving more uniform transitions. Beyond that, cathode sputter is a process capable of depositing atoms and atom compounds at lower temperatures, and hence affording better control of the temperature stresses on the substrate. In addition, in the cathodic sputter as in other plasma-aided processes, the vapor contains ions which may be drawn onto the layer and make it more compact when a biasing current is applied to the substrate; in the case of the rubber wiper, that may involve a metal strip over which to guide the wiper lip.

Adapted to the contour of the rubber wiper is a hollow cathode injector representing a linear source to be preferably employed in cathode sputter. It is a source capable of elevated rates of deposition, coupled with high-quality coatings. In addition, the hollow cathode possesses a large linear spacing between the surface of the anode and the surface of the cathode, whereby in operating the injector a linear flow is attained between the cathode and the anode, thereby preventing contamination and clogging of the cathode.

In the case of plasma injectors, a powder or liquid is fed to a plasma jet, fired by an electric arc, accelerated onto the rubber wiper and deposited thereon fused or smelted.

The heat of the plasma may be at the same time used for the pretreatment of the rubber wiper, thereby attaining particularly fast film growth.

In principle, the processes may be applied under vacuum or under atmospheric pressure. One embodiment of the invention proposes that the processes be performed under atmospheric conditions or at least under limited vacuum, which do tend to produce more coarse-grained and softer layers, dispensing with cost-intensive vacuum facilities and affording as a rule higher rates of deposition.

For the coatings under atmospheric or low-vacuum conditions, particularly good results have been achieved with corona and/or barrier discharge sources and/or plasma jets. With these techniques, it is possible to achieve high rates of deposition and cost-effective coatings. Structurally, the coatings are soft and therefore intrinsically well suited to matching the properties of the rubber wiper.

The PVD and CVD processes described here lend themselves to individual or combined use in different configurations. Where various different processes are employed, it is advisable to use for the inner layer processes apt to produce fast film growth and soft layers matching the materials of the rubber wiper. Best suited to the outer hard and thin regions are processes apt to produce with moderate film growth hard and wear-resistant layers. Preferably, the coating is incorporated in a continuous production cycle, thereby saving space, time and cost. Particularly suited are continuous production cycles in which the rubber wiper is extruded and fed under atmospheric pressure through differentially pumped vacuum or reaction chambers in contact with the coating sources.

BRIEF DESCRIPTION OF THE DRAWING

Additional advantages are disclosed in the drawing described hereunder, illustrating exemplified embodiments of the invention. The drawing, the description and the claims contain numerous features in combination. The expert may give individual consideration to the characteristics, and consolidate them into further rational combinations.

The drawings include.

DESCRIPTION OF EXEMPLIFIED EMBODIMENTS

Figure 1:
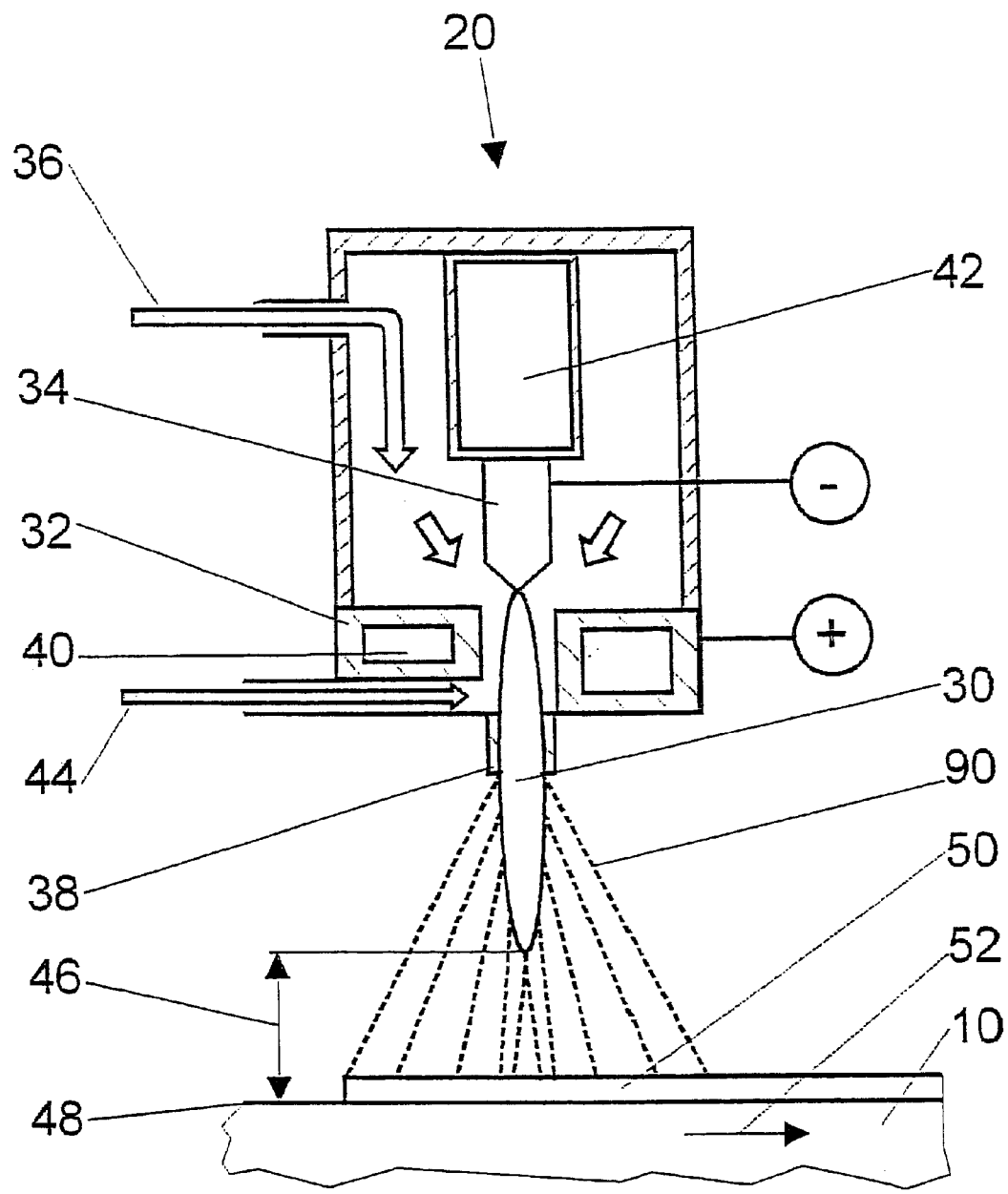
FIG. 1 is a schematic cross-sectional view of the plasma source, in this instance a plasma jet source, and rubber wiper treated by it.

FIG. 1 shows schematically a plasma source 20 with a ring-shaped anode 32 and a rod-shaped cathode 34. On one side of the plasma source 20, a plasma gas 36 is fed past the cathode 34 and over the anode 32, being thereby converted into a plasma-shaped state or activated into a hot plasma flow 30. A nozzle 38 lends the proper form to plasma 30. To prevent combustion or fusing of the cathode 34, the anode 32 and the nozzle 38, the same are cooled through cooling water ducts 40, 42.

In the area of the anode 32, a monomer gas 44 is added to the plasma 30, fragmented by it and propelled in the direction of a rubber wiper 10. The rubber wiper 10 is fed at a distance 46 along the plasma 30 in the direction 52, so as to give the fragmented monomer gas 90 on the way to the rubber wiper 10 sufficient time for a preliminary reaction. Nevertheless, it is also possible to feed the rubber wiper 10 through the plasma 30, to be coated in the process. The monomer gas 90 deposits onto the rubber wiper 10 and reacts on its surface 48 into a highly cross-linked coating system 50 or an individual coating. It is also possible to feed in lieu of the monomer gas 44 a pulverized coating material to the plasma 30, to be fused by it, propelled in the direction of the rubber wiper 10 and form on its surface 48, with or without a chemical reaction, a coating system or an individual coating.

Figure 2:
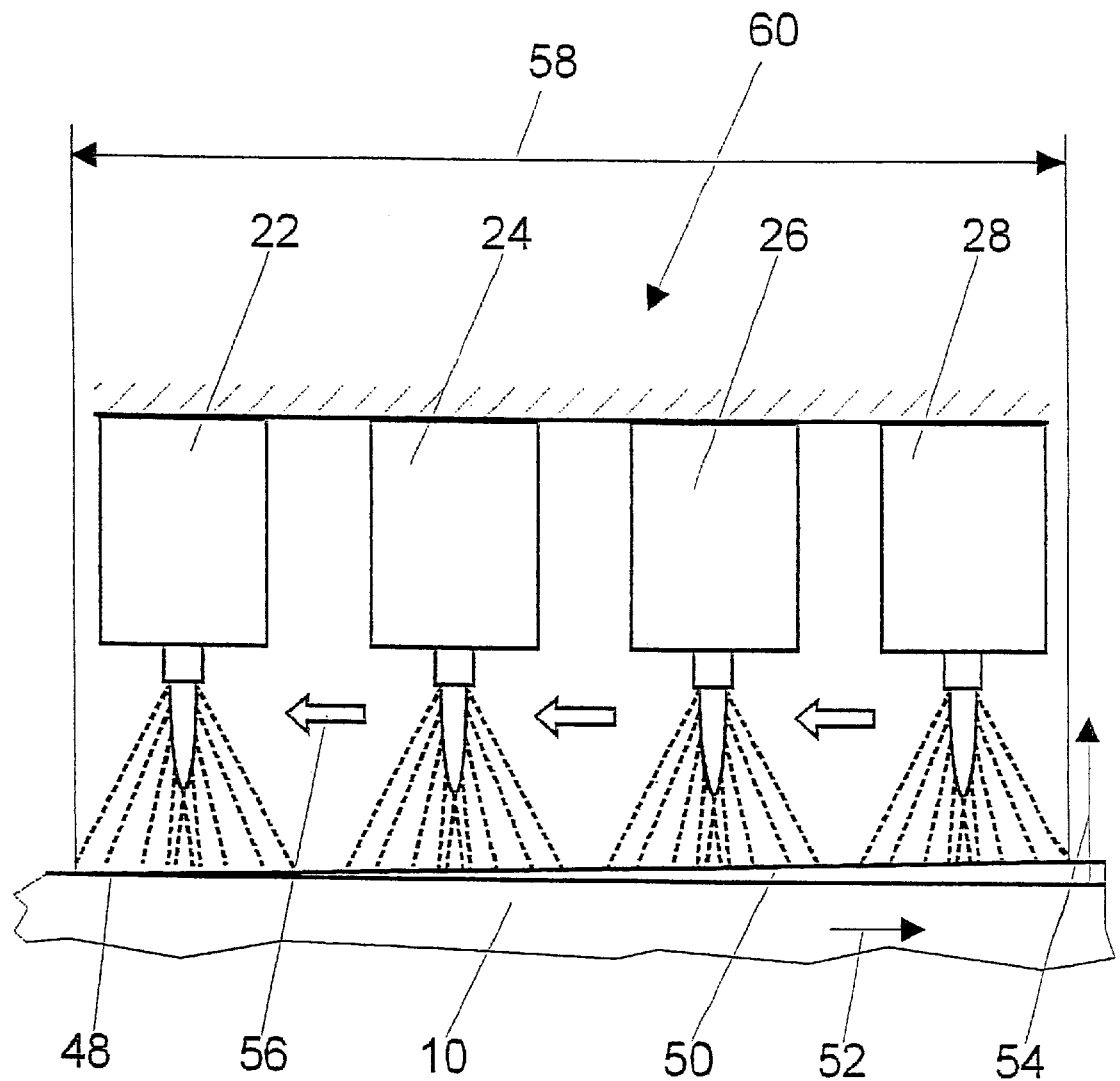
FIG. 2 is a diagrammatic view of several plasma sources arranged in a row and a rubber wiper coated by them.

FIG. 2 shows several plasma sources 22, 24, 26, 28 arranged in sequence, along which the rubber wiper 10 is fed in direction 52. In order to achieve within the coating system 50 in direction 54 perpendicular to the rubber wiper 10 different substance properties, the plasma sources 22, 24, 26, 28 are operated with gases of different composition or concentration. It is furthermore possible for the plasma sources to be operated at different performance levels or arranged at different spacings away from the rubber wiper 10.

Figure 3:
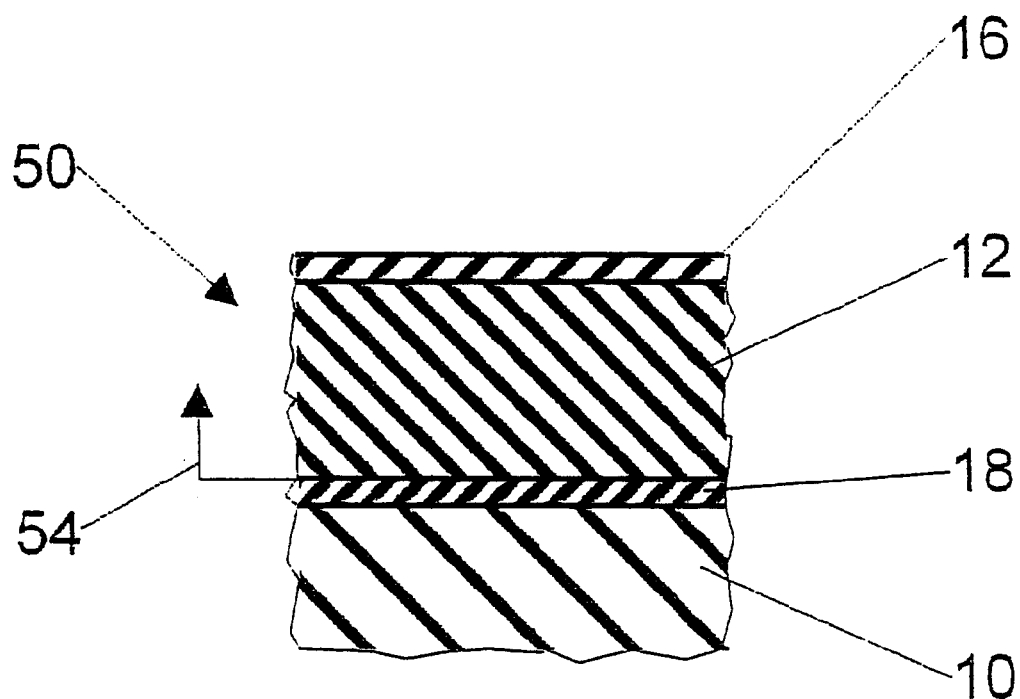
FIG. 3 is a detailed cutaway cross-sectional view through a gradient protective coating formed on a rubber wiper according to the invention.
Figure 4:
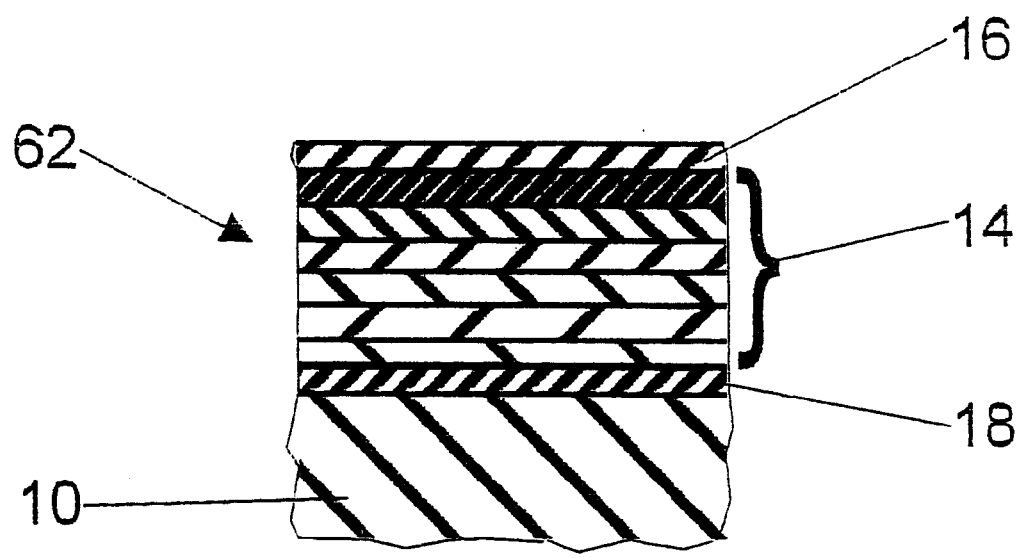
FIG. 4 is a detailed cutaway cross-section view through a protective coating comprising several coating layers according to the invention.

With the different plasma sources 22, 24, 26, 28, it is possible to produce a sequence of many thin, different coatings, also designated as multi-ply layers 14, and/or a gradient layer 12, wherein the parameters and the properties of the materials change consistent with one or several infinitely variable chemical gradients (FIGS. 3 and 4). The gradient layer 12 is obtained by a suitably short array of plasma sources 22, 24, 26, 28 or by feeding the rubber wiper 10 past the plasma sources 22, 24, 26, 28 at a commensurate speed. In the process, the coating materials blend on the surface 48 of the rubber wiper 10. Moreover, the fragmented monomer gases 90, even before impacting the rubber wiper 10, may be mixed by the resultant flows 56 or by the corresponding angles of emission of the plasma sources 22, 24, 26, 28. It is also feasible for the rubber wiper 10 to be guided step by step along the length 58 of the coating range 60, and operate the plasma sources 22, 24, 26, 28 uniformly, while changing the composition of the gas and/or the energy input over a period of time, in order to produce a gradient layer 12 or a multi-ply layer 14. Nevertheless, a continuous coating process can be more favorably incorporated in the production cycle of a rubber wiper 10.

In order to ensure superior adhesion of the coating system 50, 62, an adhesion-enhancing layer 18 is applied in a first step onto the rubber wiper 10, as illustrated in the magnified cutouts of rubber wiper 10 shown in FIGS. 3 and 4. Next, the gradient layer 12 shown in the example of FIG. 3, and the multi-ply layer 14 shown in the example of FIG. 4 were applied. The coating systems 50, 62 both terminate with a hard, thin and wear-resistant layer 16. It is also possible for the rubber wiper 10 to be coated with just one gradient layer 12 or just one multi-ply layer 14.

Both of these coating systems 50 and 62 are internally elastic and soft, matched to the material properties of the mostly elastomer-constructed rubber wiper 10. In direction 54 perpendicular to the rubber wiper 10, the hardness increases up to the outermost layer 16, thereby creating a wear-resistant, inherently flexible coating system 50, 62, able to match the deformations of rubber wiper 10 and remain safely bonded thereto over an extended period of time. Along with the continuous increase of hardness within the coating systems 50, 62, it may prove advisable to alternate between hard and soft layer surfaces, for example soft/hard/soft/hard, in order to enhance the elasticity of the system and/or reduce stresses. The coating systems 50, 62 are preferably between 200 nm and 2 $\mu$m thick.

Figure 5:
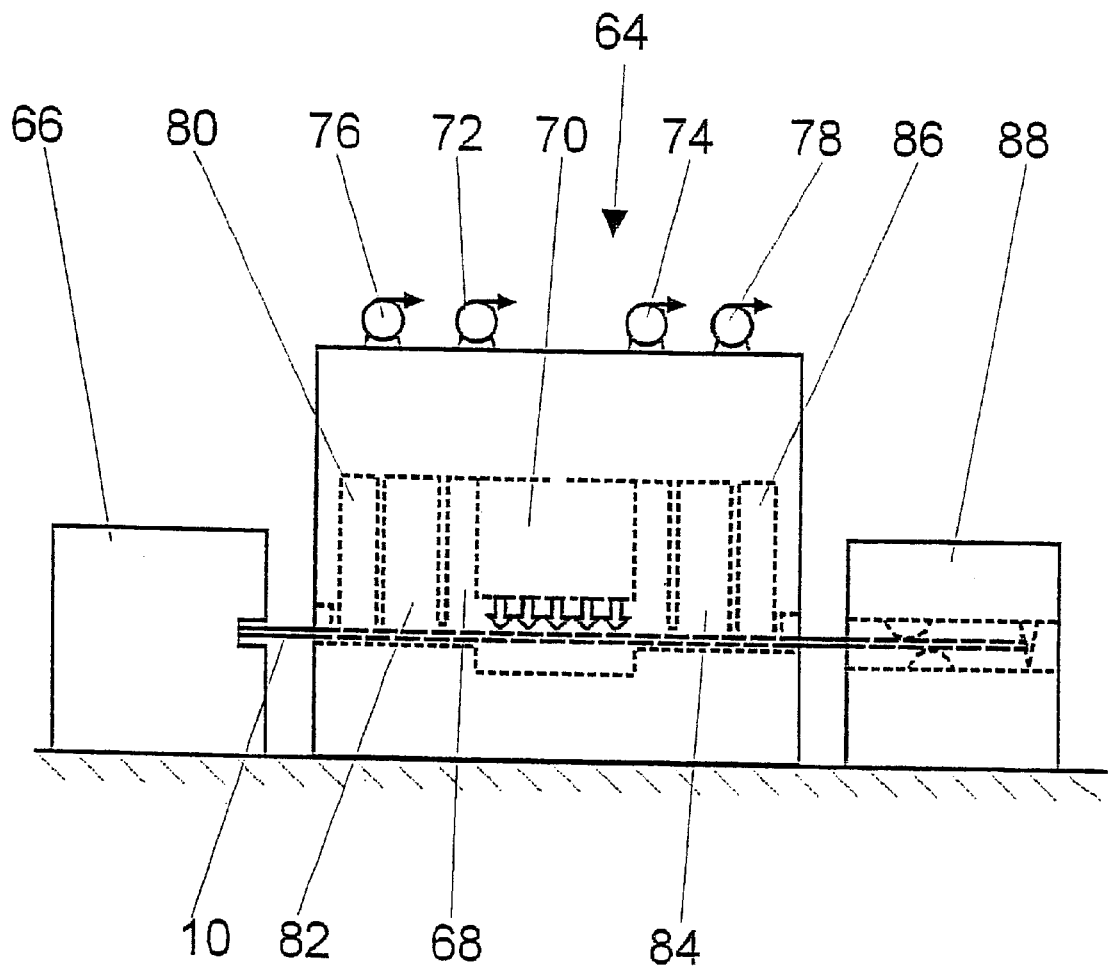
FIG. 5 is a diagrammatic view of a coating installation incorporated in a rubber wiper production process.

FIG. 5 illustrates a vacuum-operated coating plant 64, incorporated in the production cycle of a rubber wiper 10. In the first stage, the elastomer is extruded in an apparatus 66 into a strand-shaped rubber wiper 10. Next, the rubber wiper 10 is fed to the coating apparatus 64, featuring in its mid-section a coating chamber 68 with coating jets 70 connected to high vacuum pumps 72, 74.

The high vacuum pumps 72, 74 are destroyed if operated against atmospheric pressure. To prevent this, preliminary vacuum chambers 80, 82, 84, 86 connected to rough vacuum pumps 76, 78 are provided in the front and rear regions of the coating apparatus 64. The vacuum pumps 72, 74, 76, 78, and especially the high vacuum pumps 72, 74 are preferably mounted in the upper portion of the coating apparatus 64, so that possible larger particles dropping downwards from the coating material do not enter and damage the vacuum pumps 72, 74, 76, 78. The plasma jets 22,24,26,28 may be mounted above the substrate bushing, or on the sides of the coating chamber 68, to coat the substrate simultaneously on both sides, or successively first on one side and then the other. Following the coating apparatus 64, the rubber wiper 10 is separated into the required lengths in an apparatus 88. This may also be done before the coating apparatus 64 in a different suitable installation.

What is claimed is:

1. A process for coating a rubber wiper made of an elastomer material with a protective coating, said process comprising the steps of:

a) generating and activating a vaporous coating material (90) by means of at least one of a plasma and a laser;

b) forming the protective coating (50,62) on a surface (48) of the rubber wiper (10) by exposing said surface (48) to the vaporous coating material (90) by at least one of a chemical vapor deposition method and a physical vapor deposition method; and c) controlling process parameters for the generating and activating of the vaporous coating material and for the forming of the protective coating on the surface of the rubber wiper (10) so that said protective coating (50, 62) includes at least three coating layers, said protective coating has a total thickness of from 200 nm to 2 $\mu$m, said at least three coating layers include at least one thicker softer one of said coating layers having elastomeric properties corresponding to those of said elastomer material and other thinner harder ones of said coating layers, and the other thinner harder coating layers have respective hardness increasing from an inner most one to an outermost one of said other thinner harder coating layers.

2. The process as defined in claim 1, wherein said other thinner harder coating layers alternate with respective ones of said at least one thicker softer coating layer.

3. The process as defined in claim 1, wherein said protective coating on said surface of said rubber wiper has a continuously increasing hardness from said surface of said rubber wiper to an outer surface of said protective coating.

4. The process as defined in claim 3, wherein during the controlling said process parameters are continuously varied.

5. The process as defined in claim 1, wherein during the controlling said process parameters are changed in a stepwise manner and said protective coating (50) comprises a multi-ply layer (14).

6. The process as defined in claim 1, further comprising forming a final topmost layer of said protective coating and wherein said final topmost layer of said protective coating consists of a hydrophobic and lubricating layer (16) having a water-wetting angle between 90 and 150°.

7. The process as defined in claim 1, further comprising applying a bias voltage to said rubber wiper (10) during the forming of the protective coating by means of an electrode and pre-treating said rubber wiper (10) with said plasma produced with a microwave discharge at 13.56 MHz.

8. The process as defined in claim 1, further comprising applying a 10 nm thick adhesion-enhancing layer (18) to said rubber wiper (10) as an initial step in the forming of the protective coating on the rubber wiper (10) and wherein said adhesion-enhancing layer (18) comprises at least one member selected from the group consisting of metallic materials, organic materials and silicon-containing materials.

9. The process as defined in claim 1, further comprising producing said plasma (3) with a plasma excitation source having a frequency between 50 KHz and 2.45 GHz and supplying a monomer gas (44) or a powdery coating material to said plasma (30) in the vicinity of an anode (32), and wherein the generating and activating of said vaporous coating material (90) from the monomer gas (44) or the powdery coating material takes place by means of said plasma (30).

10. The process as defined in claim 9, wherein said plasma excitation source is operated with magnetic field activation and said frequency is 2.45 GHz.

11. The process as defined in claim 9, wherein said frequency is 13.56 MHz.

12. The process as defined in claim 9, wherein said plasma excitation source comprises a plurality of pulsed sources (20, 22, 24, 26, 28).

13. The process as defined in claim 1, further comprising coating the rubber wiper with one comparatively softer layer outside of said plasma and then with another comparatively harder layer in said plasma.

14. The process as defined in claim 1, wherein said activating of said vaporous coating material (90) takes place by means of said laser and said forming of said protective coating on said surface only takes place on a portion of said surface which comes into contact with a windshield on which said rubber wiper is installed.

15. The process as defined in claim 1, wherein said generating and said activating of said vaporous coating material (90) for the forming of the protective coating takes place by means of said plasma and wherein said plasma is produced by a hollow cathode source, a corona discharge source or a barrier discharge source at or below atmospheric pressure.

16. The process as defined in claim 1, further comprising applying a biasing potential to said rubber wiper by means of an electrode mounted behind said rubber wiper, whereby ions from said plasma are attracted to said rubber wiper during the forming of the protective coating.

17. The process as defined in claim 16, wherein the biasing potential applied to said rubber wiper is a pulsed potential having a pulsing frequency from 10 KHz to two MHz.

18. The process as defined in claim 17, wherein said pulsing frequency is from 50 to 250 KHz.

19. The process as defined in claim 1, consisting of a continuous production cycle performed with differentially pumped continuous processing equipment and wherein said differentially pumped continuous processing equipment includes a vacuum-operated coating plant (64), said vacuum-operated coating plant (64) includes preliminary vacuum chambers (80,82,84,86) and rough vacuum pumps (76,78) connected to said vacuum chambers in a front and rear region thereof as well as high vacuum pumps (72,74) in an upper region thereof.

20. The process as defined in claim 19, further comprising arranging respective plasma sources (22, 24, 26, 28) in succession one after the other in said vacuum-operated coating plant (64), moving said rubber wiper (10) in a direction (52) by said plasma sources and operating said plasma sources with at least one of correspondingly different gas compositions and correspondingly different gas concentrations.

* * * * *